United States Patent
Kato

(10) Patent No.: US 10,488,761 B2
(45) Date of Patent: Nov. 26, 2019

(54) EXPOSURE APPARATUS, SURFACE POSITION CONTROL METHOD, EXPOSURE METHOD, AND SEMICONDUCTOR DEVICE MANUFACTURING METHOD

(71) Applicant: Toshiba Memory Corporation, Minato-ku (JP)

(72) Inventor: Yoshimitsu Kato, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/909,748

(22) Filed: Mar. 1, 2018

(65) Prior Publication Data

US 2019/0079402 A1 Mar. 14, 2019

(30) Foreign Application Priority Data

Sep. 13, 2017 (JP) .................. 2017-175440

(51) Int. Cl.
*G03B 27/42* (2006.01)
*G03F 7/22* (2006.01)
*G03F 9/00* (2006.01)

(52) U.S. Cl.
CPC .............. *G03F 7/22* (2013.01); *G03B 27/42* (2013.01); *G03F 9/7026* (2013.01); *G03F 9/7034* (2013.01)

(58) Field of Classification Search
CPC .... G03F 7/70641; G03F 1/44; G03F 7/70683; G03F 7/706; G03F 9/7026; G03F 1/84; G03F 7/70433; G03F 7/7085; H04N 5/23212; G02B 21/241; G02B 26/128; G02B 27/62; G02B 7/04; G03B 13/32; G03B 13/36; G06T 7/13

See application file for complete search history.

(56) References Cited

U.S. PATENT DOCUMENTS

| 6,400,456 | B1 | 6/2002 | Miyachi |
| 6,559,465 | B1 * | 5/2003 | Yamada .............. G03F 7/70358 |
| | | | 250/559.29 |
| 2008/0291414 | A1 | 11/2008 | Tsutsumi et al. |

FOREIGN PATENT DOCUMENTS

| JP | 2001-93813 | 4/2001 |
| JP | 3305448 | 7/2002 |
| JP | 2008-288347 | 11/2008 |
| JP | 2014-99562 | 5/2014 |
| JP | 2017-3617 | 1/2017 |

* cited by examiner

*Primary Examiner* — Mesfin T Asfaw
(74) *Attorney, Agent, or Firm* — Oblon, McClelland, Maier & Neustadt, L.L.P.

(57) ABSTRACT

According to one embodiment, there is provided an exposure apparatus, including a focus detecting system, a stage, and a controller. On the stage, a substrate is to be mounted. The controller performs focus measurement on an incomplete shot area, part of which is outside a pattern forming area of the substrate, by the focus detecting system. The controller obtains amounts of defocus of a plurality of planes that are candidates for approximating the incomplete shot area according to the result of measuring the incomplete shot area. The controller decides on a plane to approximate the incomplete shot area from among the plurality of planes according to the amounts of defocus of the plurality of planes. The controller drives the stage using a focus-leveling value according to the decided-on plane so as to control a surface position of the incomplete shot area.

20 Claims, 8 Drawing Sheets

EXPOSURE APPARATUS, SURFACE POSITION CONTROL METHOD, EXPOSURE METHOD, AND SEMICONDUCTOR DEVICE MANUFACTURING METHOD

CROSS-REFERENCE TO RELATED APPLICATIONS

This application is based upon and claims the benefit of priority from Japanese Patent Application No. 2017-175440, filed on Sep. 13, 2017; the entire contents of which are incorporated herein by reference.

FIELD

Embodiments described herein relate generally to an exposure apparatus, a surface position control method, an exposure method, and a semiconductor device manufacturing method.

BACKGROUND

An exposure apparatuses measures the position along a height direction of a surface of a substrate and, on the basis of the measuring result, controls the relative position (surface position) between an optical system and the surface of the substrate. It is desired to improve accuracy in the control of the surface position.

DETAILED DESCRIPTION

In general, according to one embodiment, there is provided an exposure apparatus, including a focus detecting system, a stage, and a controller. On the stage, a substrate is to be mounted. The controller performs focus measurement on an incomplete shot area, part of which is outside a pattern forming area of the substrate, by the focus detecting system. The controller obtains amounts of defocus of a plurality of planes that are candidates for approximating the incomplete shot area according to the result of measuring the incomplete shot area. The controller decides on a plane to approximate the incomplete shot area from among the plurality of planes according to the amounts of defocus of the plurality of planes. The controller drives the stage using a focus-leveling value according to the decided-on plane so as to control a surface position of the incomplete shot area.

Exemplary embodiments of an exposure apparatus will be explained below in detail with reference to the accompanying drawings. The present invention is not limited to the following embodiments.

Embodiment

An exposure apparatus according to an embodiment will be described. Exposure apparatuses are used in manufacturing semiconductor devices, especially in photolithography processes. The exposure apparatus measures the position along a height direction of a surface of a substrate and, on the basis of the measuring result, controls the relative position (surface position) between an optical system and the surface of the substrate. That is, the exposure apparatus measures recesses and protrusions in the surface of a substrate by a focus sensor and controls the surface position of the substrate to follow the recesses and protrusions in the surface of the substrate so that defocus does not occur at the time of exposure of the substrate.

Figure 1:
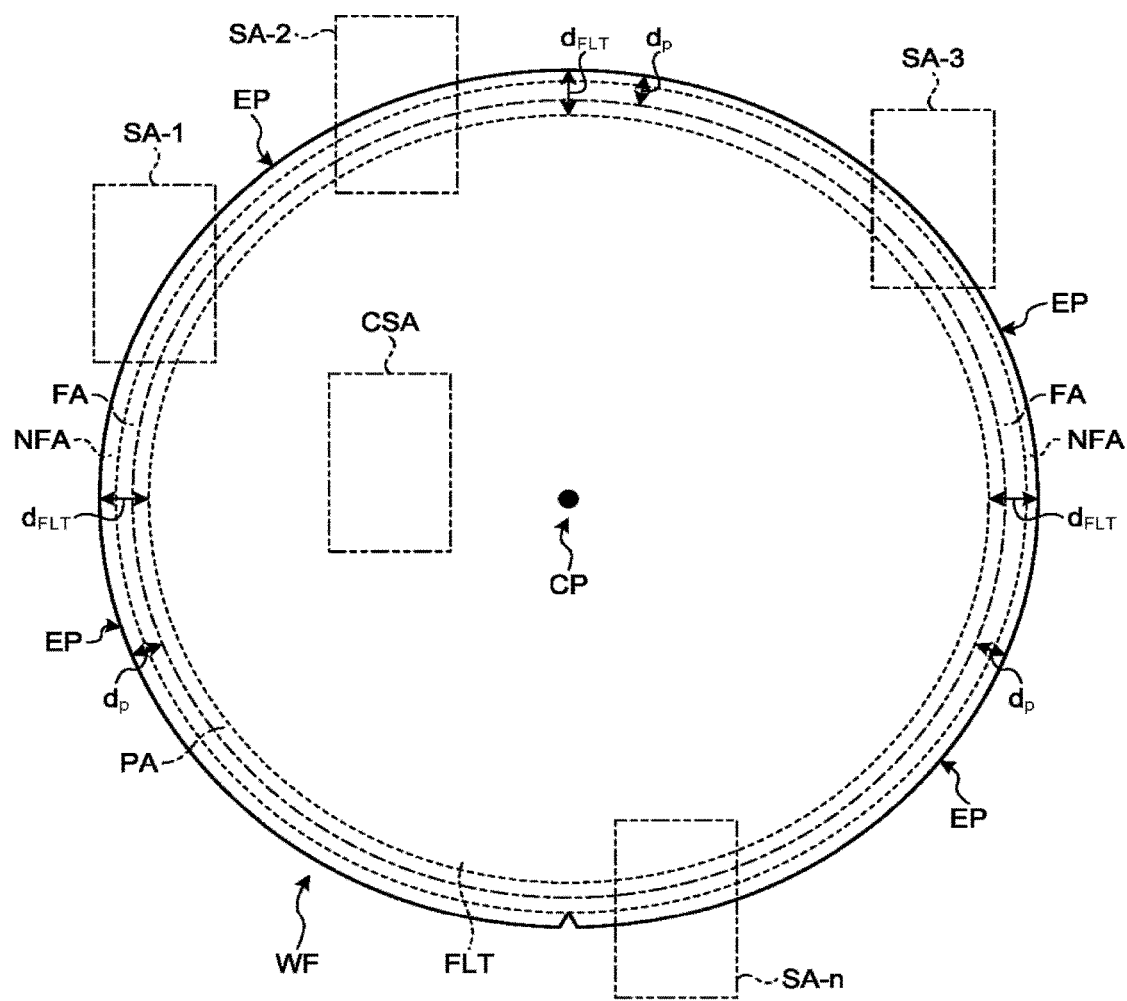
FIG. 1 is a diagram illustrating a pattern forming area and incomplete shot areas in an embodiment.

As illustrated in FIG. 1, a pattern forming area PA in which device patterns are to be formed on the surface of a substrate WF, is secured extending from the center CP side of the substrate WF to the position at about a given distance $d_p$ away from the outer edge EP. FIG. 1 is a diagram illustrating the pattern forming area PA and incomplete shot areas PA. Here, in the pattern forming area PA of the substrate WF, the neighborhood of the outer edge EP is not flat as compared with the vicinity of the center CP. Although a complete shot area (e.g., a complete shot area CSA) that is all contained in the pattern forming area PA is flat almost over the whole, parts of the pattern forming area PA in incomplete shot areas SA-1 to SA-n, parts of which are outside the pattern forming area PA of the substrate WF, may include many non-flat regions.

It can be thought of that, for example, because the area extending from the center CP side of the substrate WF to the position at about a given distance $d_{FLT}$ ($>d_p$) away from the outer edge EP is almost flat, focus measurement is performed on only this area FLT and that with the measurement result as a focus reference area, the surface position of the substrate is controlled. In this case, in scan exposure in a slit direction or static exposure, the position is controlled to be in a plane, so that deviation from the plane is defocus and that the amount of defocus is likely to increase. That is, the cross-section of the substrate WF near the outer edge EP may be a curved surface in which the angle of inclination gradually increases, but the curvature can be different for each position, so that the control of the surface position using the area FLT extending to about the given distance $d_{FLT}$ from the outer edge EP as the focus reference area, may decrease accuracy in the control of the surface position of the substrate WE because there are places where the amount of defocus is likely to increase remarkably.

Accordingly, in the present embodiment, in the exposure apparatus, focus measurement is performed up to the outer edge EP of the substrate WE in advance, and for the incomplete shot areas SA, by deciding on an approximate plane for the pattern forming area PA and controlling the surface position of the substrate WE with a focus-leveling value according to that approximate plane, accuracy in the control of the surface position is improved.

Figure 2:
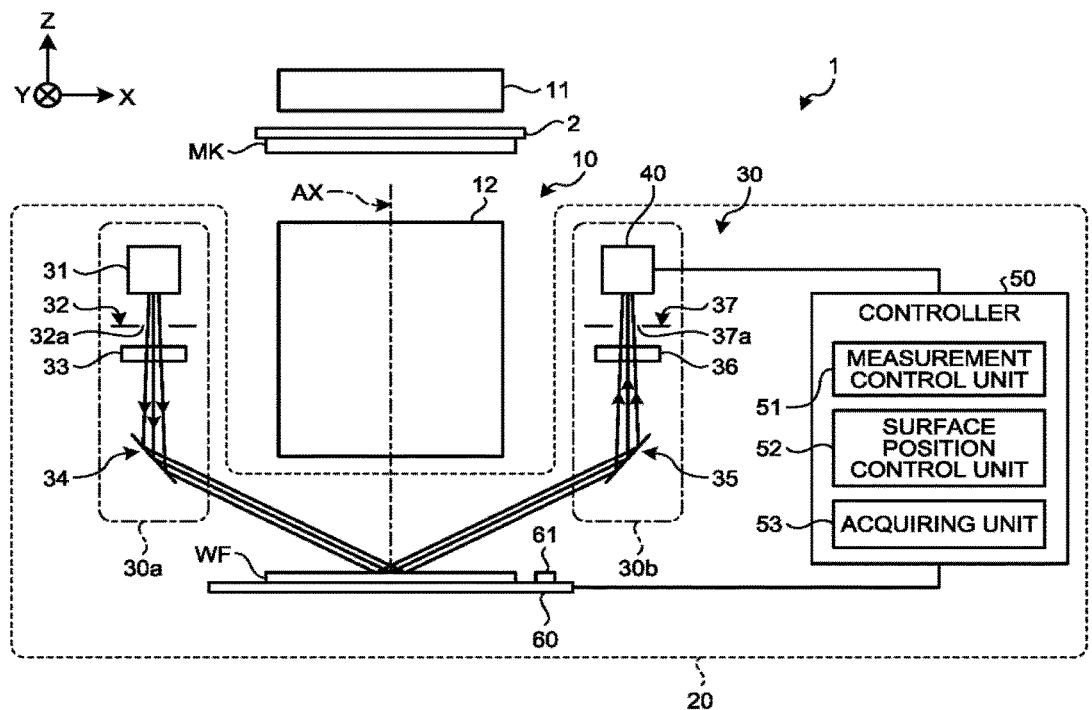
FIG. 2 is a diagram illustrating the configuration of an exposure apparatus according to the embodiment.

Specifically, an exposure apparatus 1 as shown in FIG. 2 is used. FIG. 2 is a diagram illustrating the configuration of the exposure apparatus 1.

The exposure apparatus 1 is, for example, a scanning exposure apparatus (scanner). The scanning exposure apparatus is an apparatus which, while synchronously moving a original (e.g., a mask) MK and a substrate (e.g., a wafer) WF in the scan direction, projects, by exposure, a pattern drawn on the original MK onto the substrate WF subject to exposure. Hereinafter, let a +Z direction be the direction going away from the substrate WF along the optical axis AX of a projection optical system 12. Let a Y direction be the synchronous movement direction (scan direction) of the original MK and the substrate WF in a plane perpendicular to the Z direction. Let an X direction be a direction (non-scan direction) perpendicular to the Z direction and Y direction. Further, let a θX direction, θY direction, and θZ direction be directions around the X axis, Y axis, and Z axis respectively.

The exposure apparatus 1 includes an optical system 10, a original stage 2, and a position control system 20. The optical system 1C includes an illumination optical system 11 and the projection optical system 12. The position control system 20 includes a substrate alignment detecting system (not shown), a focus detecting system 30, a controller 50, and a substrate stage 60.

The illumination optical system 11, the original stage 2, and the projection optical system 12 are arranged with the optical axis AX as their center. The optical axis AX is an axis indicating the direction in which the chief ray of exposure light travels from a light source (not shown) to the substrate WF.

The substrate stage 60 holds the substrate SIP. The substrate stage 60 moves in the X, Y, and Z directions and rotates in the θX, θY, and θZ directions while holding the substrate WF. The θX, θY, and θZ directions are rotational directions around the X direction axis, Y direction axis, and Z direction axis respectively. By this means, the substrate stage 60 positions the substrate WF. A fiducial mark 61 is formed on the top of the substrate stage 60.

The original stage 2 is placed in the direction of the substrate stage 60 with the projection optical system 12 in between. The projection optical system 12 projects, by exposure, light incident on the original MK onto the substrate WF to form an image according to a pattern drawn on the original MK on the substrate WF.

The illumination optical system 11 is placed in the +Z direction of the original stage 2. The illumination optical system 11 illuminates an illumination area of the original MK with exposure light having a uniform illumination distribution. The exposure light is diffracted by the pattern drawn on the original MK and incident on the projection optical system 12.

The substrate alignment detecting system (not shown) performs alignment measurement to detect the position in the X and Y directions (surface direction position) of the substrate WF.

The focus detecting system 30 includes a projecting system 30a and a light receiving system 30b. The projecting system 30a and the light receiving system 30b are located at positions opposite each other and in obliquely upward directions of an object to be measured (e.g., the substrate WF). The projecting system 30a includes a projecting unit 31, a diaphragm 32, a halving glass 33, and a mirror 34. The light receiving system 30b includes a mirror 35, a halving glass 36, a diaphragm 37, and a light receiving unit 40.

Light irradiated by the projecting unit 31 travels along the optical axis in the −Z direction and passes through an opening 32a of the diaphragm 32 and, after its optical axis is adjusted by the halving glass 33, is reflected by the mirror 34 to travel in the +X direction so as to form an image (measurement point) in a predetermined shape on the substrate WE and be reflected. The reflected light travels in the +X direction and is reflected by the mirror 35 to travel along the optical axis in the +Z direction and, after its optical axis is adjusted by the halving glass 36, passes through an opening 37a of the diaphragm 37 to re-form an image in a predetermined shape on the light receiving unit 40. By this means, the focus detecting system 30 performs focus measurement to detect the position in the direction of the substrate WF.

The controller 50 includes an acquiring unit 53, a measurement control unit 51, and a surface position control unit 52.

The acquiring unit 53 acquires information about a substrate map beforehand. The substrate map information includes, for example, information about the arrangement positions of multiple shot areas on the substrate WF and information about the pattern forming area PA on the substrate WF. For example, the substrate map information is inputted from a user to the acquiring unit 53 via an input interface (not shown). Or the acquiring unit 53 receives the substrate map information from a predetermined device via a communication interface (not shown) over a communication line. The acquiring unit 53 supplies the acquired substrate map information to the measurement control unit 51 and the surface position control unit 52.

The measurement control unit 51 holds the substrate map information supplied from the acquiring unit 53 beforehand. The measurement control unit 51 controls focus measurement based on the substrate map information. The measurement control unit 51 controls the light receiving unit 40 based on the substrate map information in focus measurement and controls the substrate stage 60 based on the substrate map information.

Figure 3:
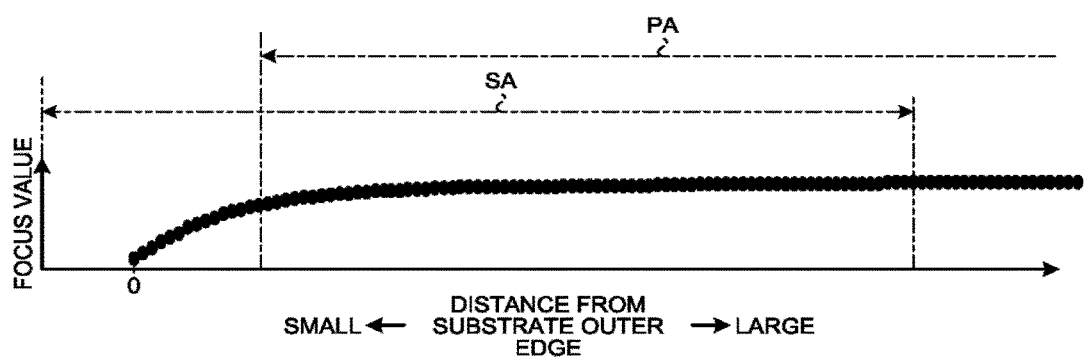
FIG. 3 is a graph illustrating the operation of a measurement control unit according to the embodiment.

For example, as illustrated in FIG. 1, it can be recognized whether the shot area to be measured is a complete shot area (e.g., a complete shot area CSA) or an incomplete shot area (one of SA-1 to SA-n) by referring to the substrate map information. If the shot area to be measured is an incomplete shot area SA, the measurement control unit 51 shown in FIG. 2 can perform focus measurement as shown in FIG. 3. FIG. 3 is a graph illustrating the operation of the measurement control unit 51. The measurement control unit 51 performs focus measurement up to the outer edge EP of the substrate WE in focus measurement for the incomplete shot area SA and thus can obtain information about the height (Z position) as shown in FIG. 3. The measurement control unit 51 supplies the measurement results of the focus measurement to the surface position control unit 52.

The surface position control unit 52 holds the substrate map information supplied from the acquiring unit 53 beforehand. The surface position control unit 52 receives the measurement results (height information) from the light receiving unit 40 of the focus detecting system 30. The surface position control unit 52 controls the relative position (surface position) in the Z direction of the substrate WF with respect to the optical system 10 based on the measurement results of the focus measurement so that the optical system 10 can form an image on the substrate WF without focus errors.

If the shot area measured is an incomplete shot area SA, the surface position control unit 52 can operate as shown in, e.g., FIGS. 4 to 8. FIGS. 4 to 8 are graphs and diagrams illustrating the operation of the surface position control unit 52.

The surface position control unit 52 determines a plurality of planes that are candidates for approximating the incomplete shot area according to the results of measuring the incomplete shot area SA (e.g., height information shown in FIG. 3). The plurality of planes correspond to a plurality of different focus reference areas encompassed in the incomplete shot area SA.

Figure 4:
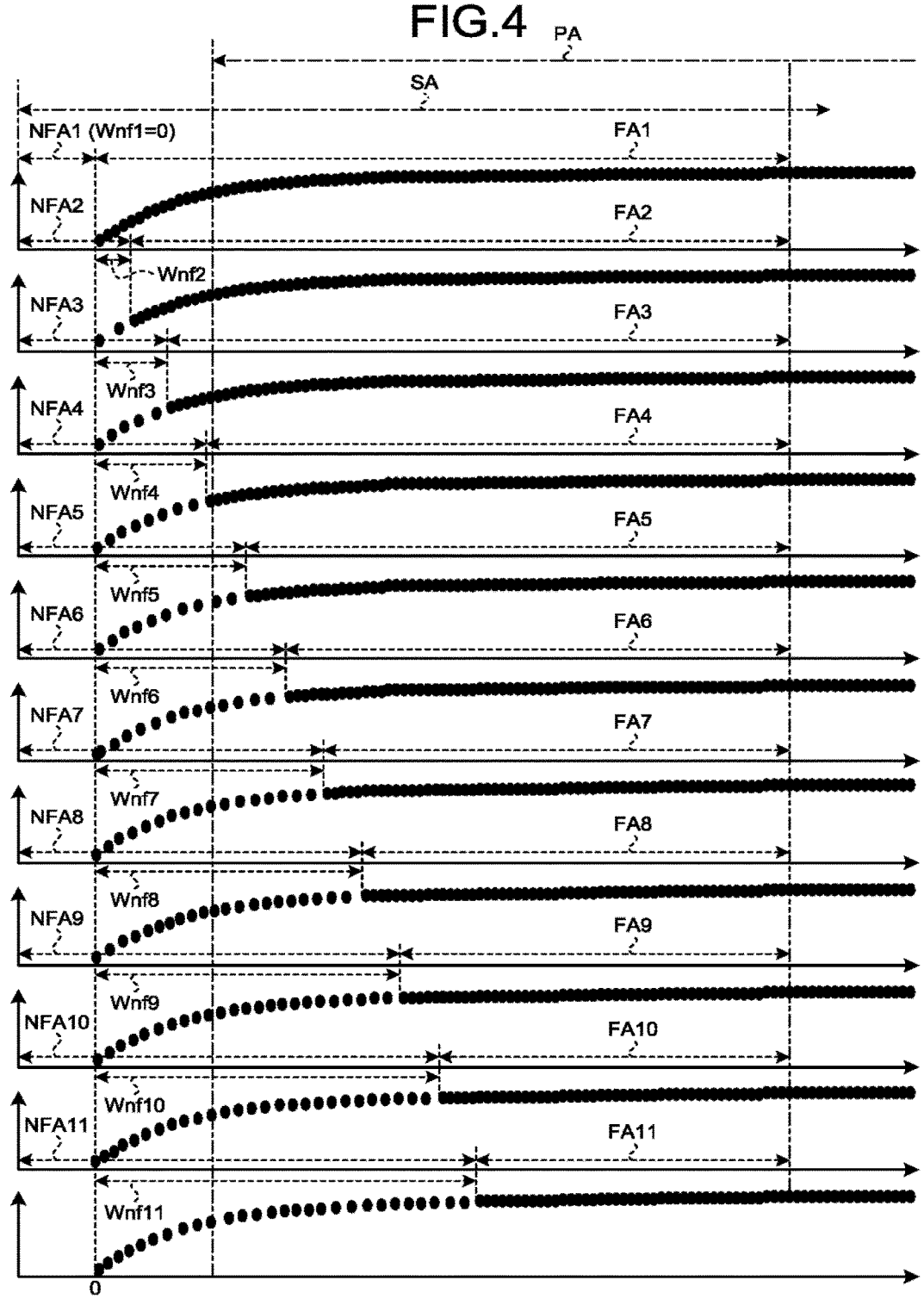
FIG. 4 is a graph illustrating the operation of a surface position control unit according to the embodiment.

Specifically, as shown in FIG. 4, when the incomplete shot area SA is divided into a focus reference area FA1 to FA11 and a focus non-reference area NFA1 to NFA11, the surface position control unit 52 determines a plurality of candidates that are the widths Wnf1 to Wnf11 of the focus non-reference areas NFA1 to NFA11 measured from the outer edge EP of the substrate WF. The magnitude relation between the widths is as follows:

$$Wnf1=0<Wnf2<Wnf3<Wnf4<Wnf5<Wnf6<Wnf7<Wnf8<Pnf9<Wnf10<Wnf11.$$

Figure 5:
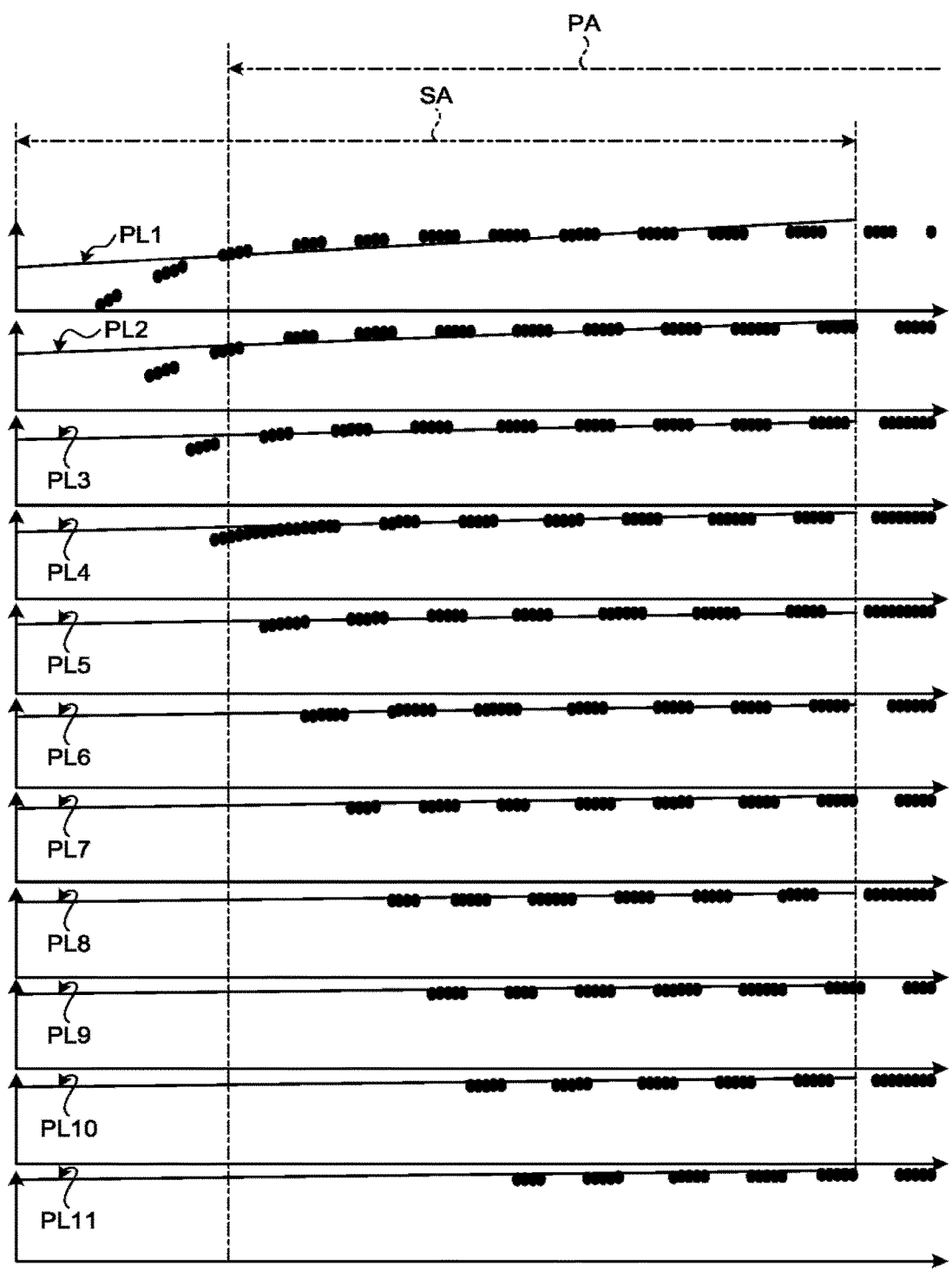
FIG. 5 is a graph illustrating the operation of the surface position control unit according to the embodiment.

The surface position control unit 52 obtains a plurality of planes PL1 to PL11 corresponding to the plurality of focus reference areas FA1 to FA11 that are candidates as shown in FIG. 5. In FIG. 5, parts corresponding to the focus reference areas FA1 to FA11 out of height information (see FIG. 3) of the surface of the substrate WF obtained by the focus measurement are indicated by broken lines, and parts corresponding to the focus non-reference areas NFA1 to NFA11 are omitted from the figure. That is, the surface position control unit 52 obtains the planes PL1 to PL11 approximating curved surfaces indicated by the broken lines for the focus reference areas FA1 to FA11 that are candidates. At this time, the surface position control unit 52 can obtain the approximating planes PL1 to FL11 according to the size of an exposure slit.

Figure 6:
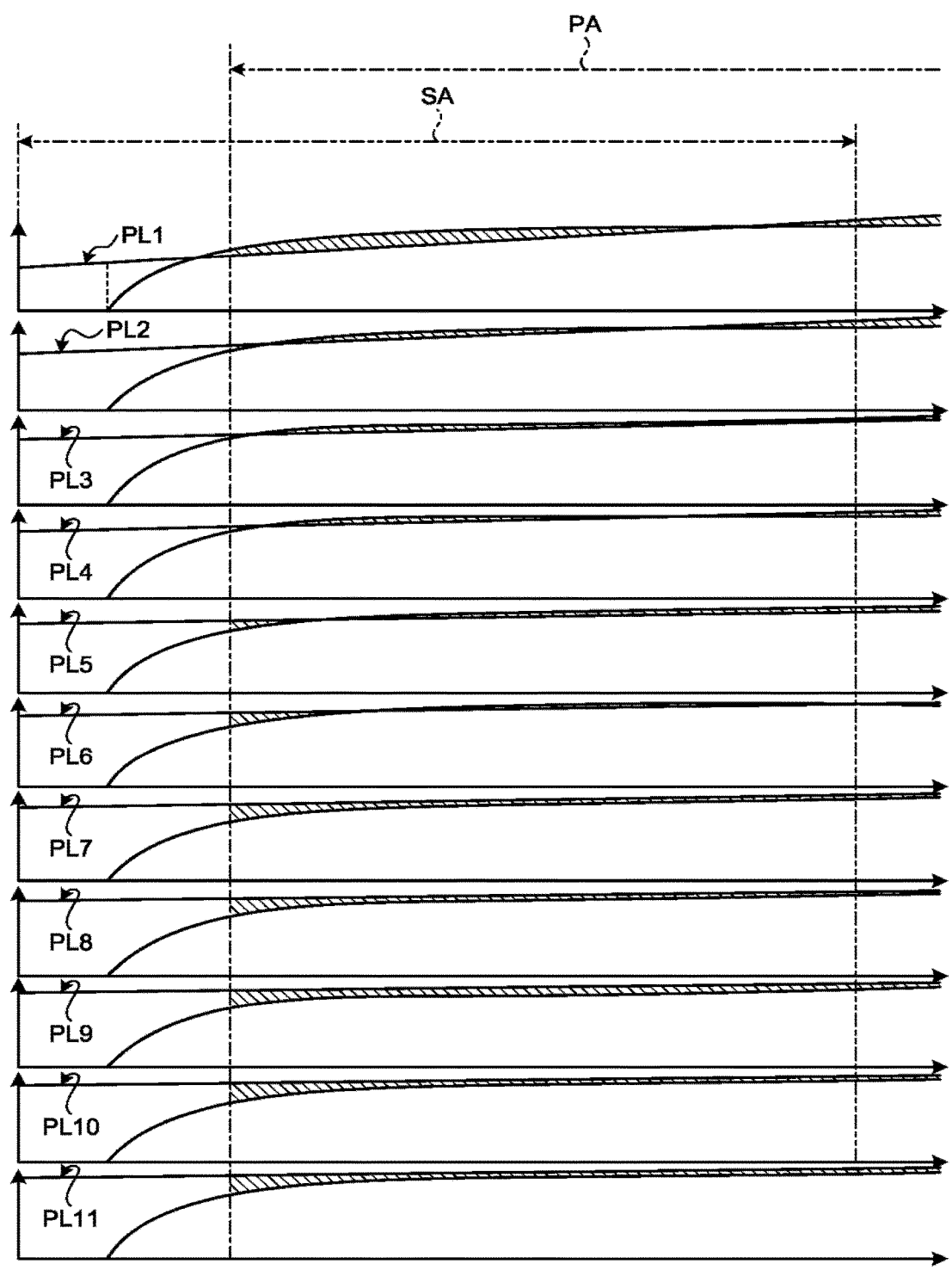
FIG. 6 is a graph illustrating the operation of the surface position control unit according to the embodiment.
Figure 7:
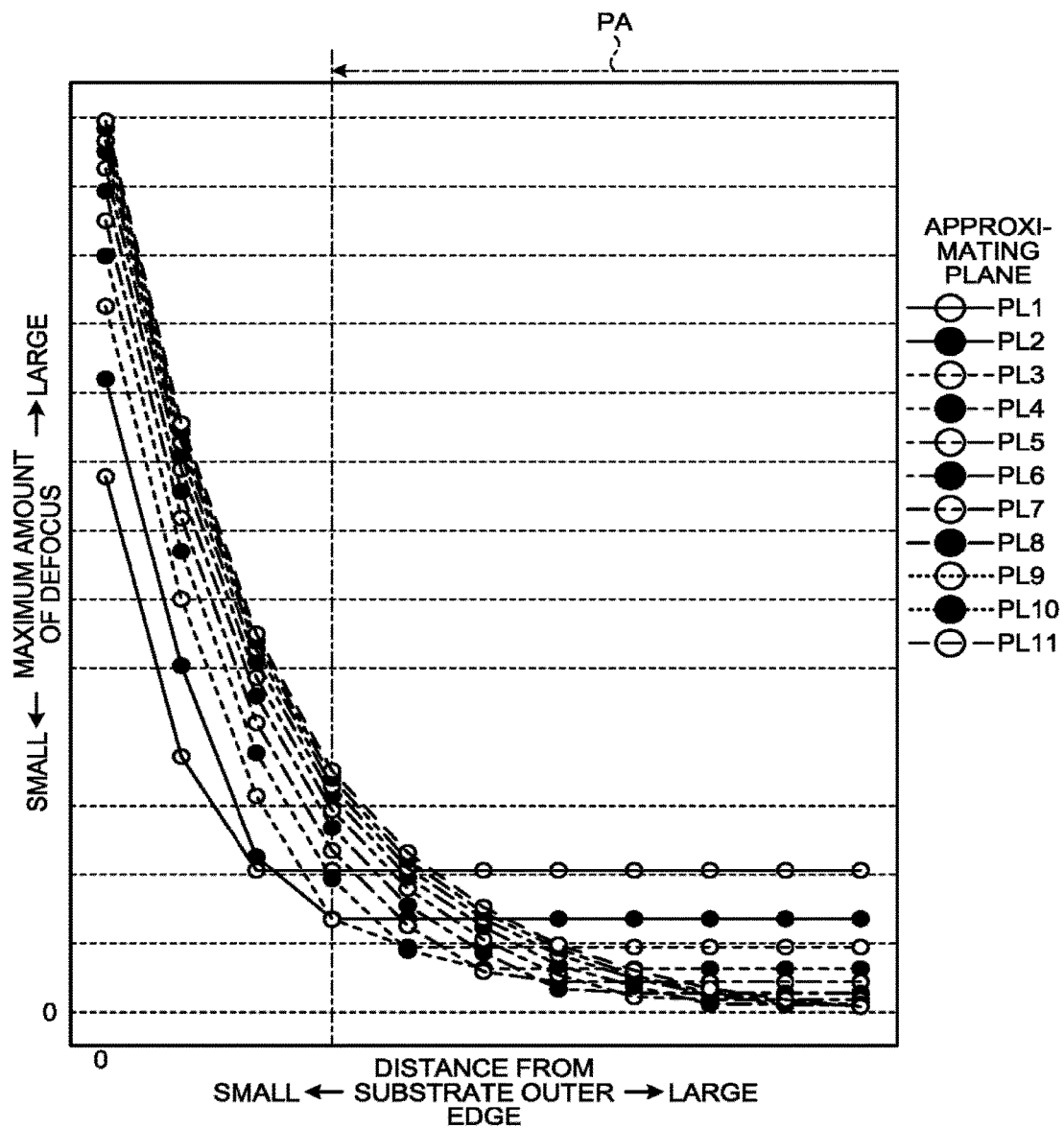
FIG. 7 is a graph illustrating the operation of the surface position control unit according to the embodiment.

The surface position control unit 52 obtains the amount of defocus in the part of the pattern forming area PA in the incomplete shot area SA for the plurality of obtained planes PL1 to PL11 as shown in FIG. 6. In FIG. 6, the amount of defocus is denoted by the area of an obliquely hatched region. FIG. 7 is a graph quantitatively indicating these amounts of defocus. In FIG. 7, the difference between the height of the plane and the height of the surface of the substrate WF is denoted as the maximum amount of defocus at each position.

The surface position control unit 52 decides on a plane to approximate the incomplete shot area SA from among the plurality of planes PL1 to PL11 according to the amounts of defocus of the planes PL1 to PL11. For example, the surface position control unit 52 determines a plane for which the amount of defocus in the part of the pattern forming area PA in the incomplete shot area SA is within an appropriate range (e.g., a plane for which the amount of defocus is the smallest) to be the plane to approximate the incomplete shot area SA. In the case of FIG. 7, the surface position control unit 52 can determine the plane PL3 for which the maximum amount of defocus in the part of the pattern forming area PA is the smallest to be the plane to approximate the incomplete shot area SA.

Figure 8A:
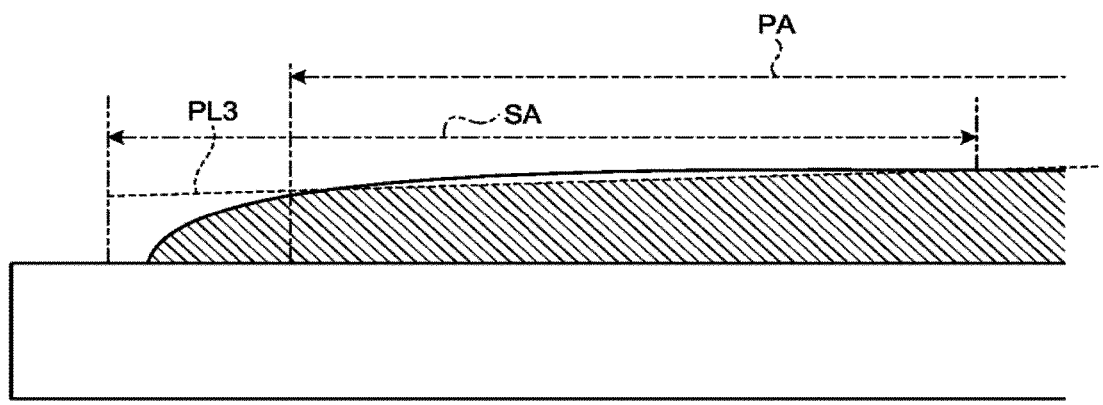
FIGS. 8A and 8B are diagrams illustrating the operation of the surface position control unit according to the embodiment.
Figure 8B:
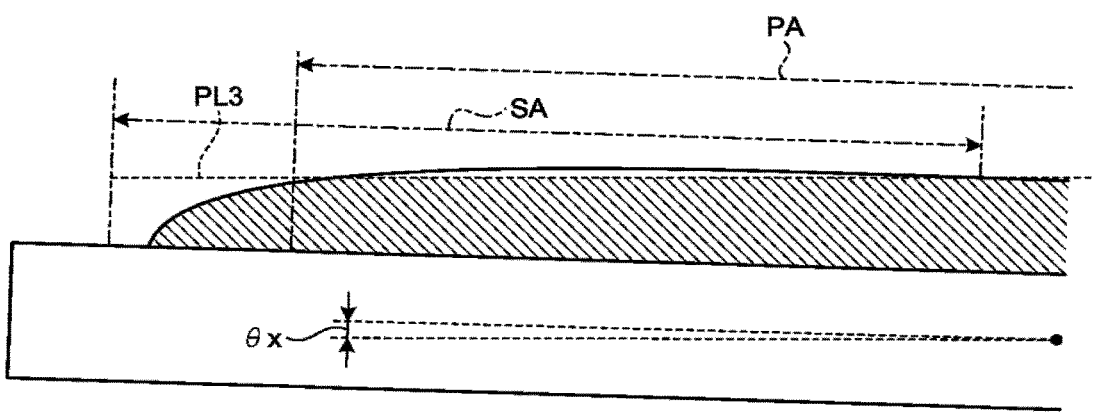

The surface position control unit 52 drives the substrate stage 60 using a focus-leveling value according to the determined plane so as to control the surface position (Z position, θX rotation amount, and θY rotation amount) of the incomplete shot area SA. For example, the surface position control unit 52 drive controls the Z position of the substrate stage 60 so that the Z position of the plane PL3 becomes close to the best focus position of the exposure apparatus 1 as shown in FIG. 8A. Then the surface position control unit 52 drive controls the θX and θY rotation amounts of the substrate stage 60 so that the plane PL3 becomes parallel to the X and Y directions (e.g., comes to coincide with the best focus plane of the exposure apparatus as shown in FIG. 8B. FIG. 8B illustrates the case where the θX rotation amount=α.

Figure 9:
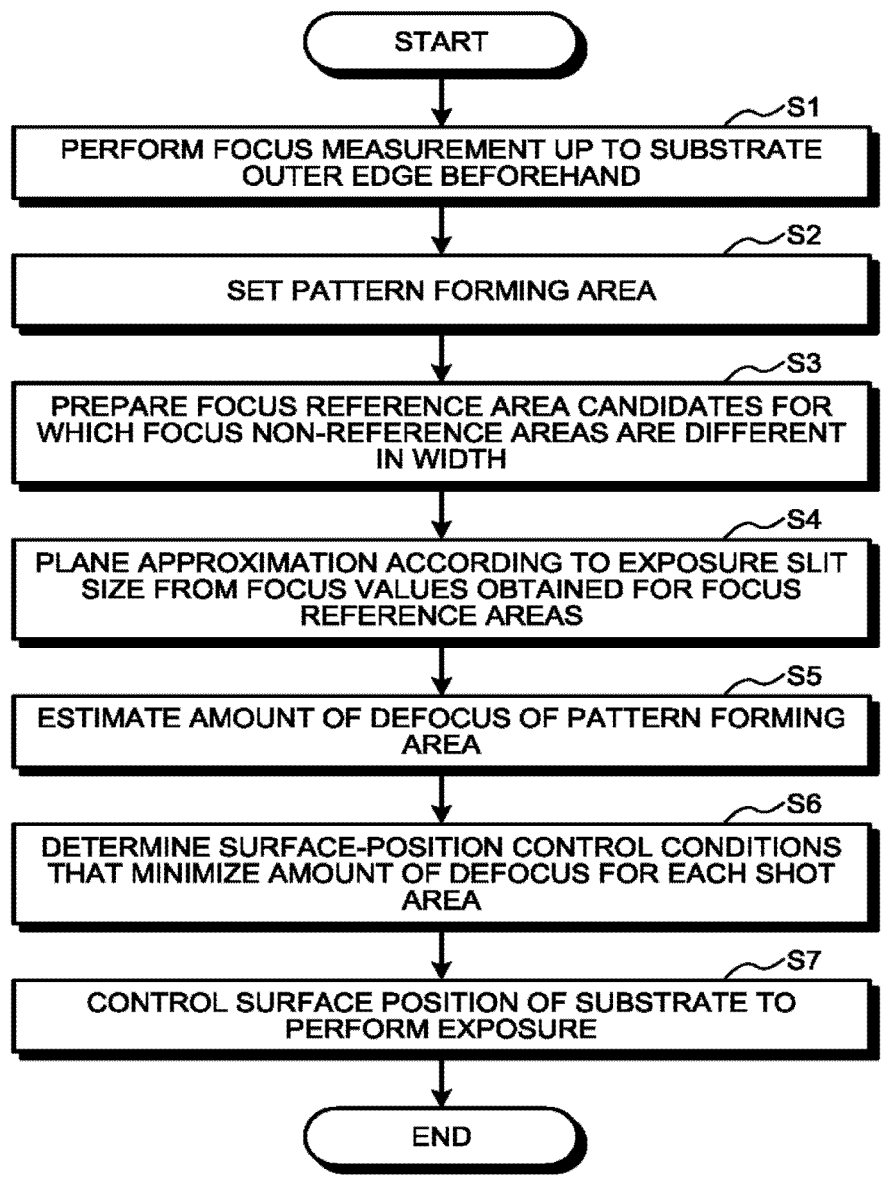
FIG. 9 is a flow chart illustrating the operation of the exposure apparatus according to the embodiment.

Next, the operation of the exposure apparatus 1 for the incomplete shot area SA will be described using FIG. 9. FIG. 9 is a flow chart illustrating the operation of the exposure apparatus 1.

The exposure apparatus 1 performs focus measurement up to the outer edge EP of the substrate WF beforehand (S1). The exposure apparatus 1 sets the pattern forming area PA on the substrate map (S2) and prepares a plurality of focus reference area candidates for which the focus non-reference areas are different in width (S3). The exposure apparatus 1 obtains a plurality of planes corresponding to the plurality of focus reference area candidates and approximating the incomplete shot area SA (S4). The exposure apparatus 1 estimates the amount of defocus of the pattern forming area PA for each of the plurality of planes approximating the incomplete shot area SA (35). The exposure apparatus 1 determines surface-position control conditions that minimize the amount of defocus (i.e., under which the maximum amount of defocus is the smallest) for each incomplete shot area SA (S6), and the exposure apparatus 1 controls the surface position of the substrate WF according to the surface-position control conditions to perform exposure (S7).

As described above, in the embodiment, the exposure apparatus 1 performs focus measurement up to the outer edge EP of the substrate WE beforehand, determines a plane to approximate the pattern forming area PA for an incomplete shot area SA, and controls the surface position of the substrate WF using a focus-leveling value according to the approximating plane. In performing this control, as shown in FIG. 1, while, for each of the plurality of incomplete shot areas SA-1 to SA-n, the width of the focus non-reference area NFA is flexibly changed, the focus reference area FA corresponding thereto can be used (see FIG. 4). Thus, accuracy in the control of the surface position can be improved for each of the plurality of incomplete shot areas SA-1 to SA-n located in the neighborhood of the outer edge EP of the substrate WF, where the shape of the cross-section can be different for each position.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus, comprising:
   a focus detecting system;
   a stage on which a substrate is to be mounted; and
   a controller
      that obtains a plurality of focus reference areas having different widths with each other, by dividing an incomplete shot area, part of which is outside a pattern forming area of the substrate, into a focus reference area of the plurality of focus reference areas and a focus non-reference area on an outer circumference side of the substrate and outward of the focus reference area, with changing a width of the focus non-reference area measured from an outer edge of the substrate, that decides on a plurality of candidate planes by approximating the plurality of focus reference areas, each of the plurality of candidate planes being a candidate for approximating the incomplete shot area, each of the plurality of candidate planes correspond to a different focus reference area, that obtains amounts of defocus of the plurality of candidate planes, that determines a plane to approximate the incomplete shot area from among the plurality of candidate planes according to the amounts of defocus of the plurality of candidate planes, and that drives the stage using a focus-leveling value according to the determined plane so as to control a surface position of the incomplete shot area.

2. The exposure apparatus according to claim 1, wherein the controller determines a plane for which the amount of defocus in part of the pattern forming area in the incomplete shot area is within an appropriate range to be the plane to approximate the incomplete shot area, from among the plurality of candidate planes.

3. The exposure apparatus according to claim 2, wherein the controller determines a plane for which a maximum amount of defocus in part of the pattern forming area in the incomplete shot area is a smallest to be the plane to approximate the incomplete shot area, from among the plurality of candidate planes.

4. The exposure apparatus according to claim 1, wherein the controller, on the basis of information about arrangement positions of a plurality of shot areas on the substrate and information about the pattern forming area on the substrate, recognizes the incomplete shot area from among the plurality of shot areas.

5. The exposure apparatus according to claim 1, wherein the controller, on the basis of information about arrangement positions of a plurality of shot areas on the substrate and information about the pattern forming area on the substrate, recognizes the incomplete shot area and a second incomplete shot area, part of which is outside the pattern forming area of the substrate, from among the plurality of shot areas.

6. The exposure apparatus according to claim 1, wherein the controller obtains a plurality of second focus reference areas having different widths with each other, by dividing a second incomplete shot area, part of which is outside the pattern forming area of the substrate, into the second focus reference area and a second focus non-reference area on the outer circumference side of the substrate and outward of the second focus reference area, with changing a width of the second focus non-reference area measured from an outer edge of the substrate, decides on a plurality of second candidate planes by approximating the plurality of second focus reference areas, each of the plurality of second candidate planes being a candidate for approximating the second incomplete shot area, each of the plurality of second candidate planes correspond to a different second focus reference area, obtains amounts of defocus of the plurality of second candidate planes, determines a second plane to approximate the second incomplete shot area from among the plurality of second candidate planes according to the amounts of defocus of the plurality of second candidate planes, and drives the stage using a second focus-leveling value according to the determined second plane so as to control a surface position of the second incomplete shot area.

7. The exposure apparatus according to claim 1, wherein the controller performs exposure on the incomplete shot area while the surface position of the incomplete shot area is controlled.

8. The exposure apparatus according to claim 1, wherein the exposure apparatus is a scanning exposure apparatus.

9. The exposure apparatus according to claim 1, further comprising:

a projection optical system arranged with an optical axis as a center of the projection optical system, wherein the focus detecting system includes:
a projecting system, and
a light receiving system located at opposite position to the projecting system with respect to the projection optical system.

10. The exposure apparatus according to claim 9, wherein the projecting system includes in order:
a projecting unit,
a first diaphragm,
a first halving glass, and
a first mirror;
the light receiving system includes in order:
a second mirror,
a second halving glass,
a second diaphragm,
a light receiving unit.

11. A surface position control method, comprising:

obtaining a plurality of focus reference areas having different widths with each other, by dividing an incomplete shot area, part of which is outside a pattern forming area of a substrate, into a focus reference area of the plurality of focus reference areas and a focus non-reference area on an outer circumference side of the substrate and outward of the focus reference area, with changing a width of the focus non-reference area measured from an outer edge of the substrate;

deciding on a plurality of candidate planes by approximating the plurality of focus reference areas, each of the plurality of candidate planes being a candidate for approximating the incomplete shot area, each of the plurality of candidate planes correspond to a different focus reference area;

obtaining amounts of defocus of the plurality of candidate planes;

determining a plane to approximate the incomplete shot area from among the plurality of candidate planes according to the amounts of defocus of the plurality of candidate planes; and controlling a surface position of the incomplete shot area using a focus-leveling value according to the determined plane.

12. The surface position control method according to claim 11, wherein deciding on the plane to approximate the incomplete shot area includes detertnining a plane for which the amount of defocus in part of the pattern fortning area in the incomplete shot area is within an appropriate range to be the plane to approximate the incomplete shot area, from among the plurality of candidate planes.

13. The surface position control method according to claim 12, wherein
deciding on the plane to approximate the incomplete shot area includes determining a plane for which a maximum amount of defocus in part of the pattern forming area in the incomplete shot area is a smallest to be the plane to approximate the incomplete shot area, from among the plurality of candidate planes.

14. The surface position control method according to claim 11, further comprising, on the basis of information about arrangement positions of a plurality of shot areas on the substrate and information about the pattern forming area on the substrate, recognizing the incomplete shot area from among the plurality of shot areas.

15. The surface position control method according to claim 11, further comprising:
on the basis of information about arrangement positions of a plurality of shot areas on the substrate and information about the pattern forming area on the substrate, recognizing the incomplete shot area from among the plurality of shot areas; and
on the basis of information about arrangement positions of the plurality of shot areas on the substrate and information about the pattern forming area on the substrate, recognizing a second incomplete shot area, part of which is outside the pattern forming area of the substrate, from among the plurality of shot areas.

16. The surface position control method according to claim 11, further comprising:
obtaining a plurality of second focus reference areas having different widths with each other, by dividing a second incomplete shot area, part of which is outside the pattern forming area of the substrate, into the second focus reference area and a second focus non-reference area on the outer circumference side of the substrate and outward of the second focus reference area, with changing a width of the second focus non-reference area measured from an outer edge of the substrate;
deciding on a plurality of second candidate planes by approximating the plurality of second focus reference areas, each of the plurality of second candidate planes being a candidate for approximating the second incomplete shot area, each of the plurality of second candidate planes correspond to a different second focus reference area;
obtaining amounts of defocus of the plurality of second candidate planes;
determining a second plane to approximate the second incomplete shot area from among the plurality of second planes according to the amounts of defocus of the plurality of second candidate planes; and
controlling a surface position of the second incomplete shot area using a second focus-leveling value according to the determined second plane.

17. An exposure method, comprising:
controlling a surface position of an incomplete shot area on a substrate using the surface position control method according to claim 11; and
performing exposure on the incomplete shot area while the surface position of the incomplete shot area is controlled.

18. A semiconductor device manufacturing method, comprising performing exposure on a substrate using the exposure method according to claim 17.

19. The surface position control method according to claim 11, further comprising:
performing focus measurement up to the outer edge of the substrate; and
setting the pattern forming area in substrate map information based on results of the focus measurement.

20. The surface position control method according to claim 19, further comprising:
recognizing the incomplete shot area by referring the substrate map information.

* * * * *